United States Patent
Fujiwara

(10) Patent No.: US 6,541,779 B2
(45) Date of Patent: Apr. 1, 2003

(54) CHARGED-PARTICLE-BEAM MICROLITHOGRAPHY APPARATUS INCLUDING SELECTABLE SYSTEMS FOR DETERMINING ALIGNMENT-MARK POSITION, AND DEVICE-FABRICATION METHODS UTILIZING SAME

(75) Inventor: Tomoharu Fujiwara, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/815,176

(22) Filed: Mar. 22, 2001

(65) Prior Publication Data

US 2001/0029082 A1 Oct. 11, 2001

(30) Foreign Application Priority Data

Mar. 22, 2000 (JP) .......................................... 2000-079581

(51) Int. Cl.⁷ .......................... H01J 37/244; H01J 37/00
(52) U.S. Cl. .................... 250/491.1; 250/306; 250/307; 250/311
(58) Field of Search .............................. 250/307, 310, 250/311, 491.1

(56) References Cited

U.S. PATENT DOCUMENTS 6,204,509 B1 * 3/2001 Yahiro et al. ............. 250/491.1
6,399,945 B1 * 6/2002 Hirayanagi ................. 250/310

\* cited by examiner

Primary Examiner—John R. Lee
Assistant Examiner—David A. Vanore
(74) Attorney, Agent, or Firm—Klarquist Sparkman LLP

(57) ABSTRACT

Charged-particle-beam microlithography apparatus are disclosed that include a system for performing alignment of a reticle and a wafer. The wafer includes at least one alignment mark that is irradiated by a charged particle beam. The irradiated alignment mark produces backscattered electrons that are detected, resulting in a backscattered-electron (BSE) data signal. Among various candidate techniques for measuring the position of the alignment mark, the apparatus automatically selects (based on the BSE data signal) a particular technique that will provide the best accuracy under the prevailing conditions of measurement.

10 Claims, 6 Drawing Sheets

CHARGED-PARTICLE-BEAM MICROLITHOGRAPHY APPARATUS INCLUDING SELECTABLE SYSTEMS FOR DETERMINING ALIGNMENT-MARK POSITION, AND DEVICE-FABRICATION METHODS UTILIZING SAME

FIELD OF THE INVENTION

The present invention pertains to microlithography (projection-transfer of a pattern from a mask or reticle to a suitable substrate) performed using a charged particle beam. Microlithography is a key technology used in the manufacture of semiconductor integrated circuits, displays, and the like. More specifically, the invention pertains to performing alignments of the reticle and the substrate.

BACKGROUND OF THE INVENTION

A charged-particle-beam (CPB) microlithography apparatus can be used to projection-transfer any of various patterns, defined by a reticle, onto a substrate. As used herein, a charged particle beam is an electron beam or an ion beam. Suitable substrates include semiconductor wafers as well as plates, masks, and reticles.

When exposing a pattern onto a substrate, a suitable alignment reference (for ensuring accurate alignment of the reticle with the substrate, for example) is the position of an alignment mark on the substrate. An alignment mark generally is defined by a layer of a "heavy" metal applied to the surface of the substrate or by forming a pattern of depressions in the substrate surface. The position of an alignment mark can be different on various substrates, and the shape or profile of an alignment mark can vary from one substrate to the next, depending upon the particular wafer-processing step.

In CPB microlithography, alignment-mark positions can be measured prior to exposure or during exposure of the substrate with a reticle pattern. Measurements typically are performed using a measurement device in the microlithography apparatus itself. Of course, maximal detection accuracy of mark position is desired.

Various conventional devices are known for measuring alignment-mark positions, including systems that respond to a threshold level of a backscattered-electron (BSE) detector signal. With such a system, the threshold ("slice") level can be set by the operator of the apparatus. A mark position is detected by scanning the charged particle beam across the mark. As the scanning beam passes over a first edge of a mark, the corresponding BSE signal (initially below the threshold level) rises above the threshold level. The signal remains above the threshold level as the beam passes across the mark. As the scanning beam passes over an opposing second edge of the mark, the corresponding BSE signal returns to a sub-threshold level. The system determines the actual mark position by calculating the sum of the first and second locations and dividing the sum by 2.

The most recent CPB microlithography apparatus provide several types of devices for measuring alignment marks. However, the operator must make a selection as to which device to use under a particular condition. This operator-based scheme is subject to error, and hence can result in an inaccurate measurement under the prevailing conditions.

SUMMARY OF THE INVENTION

In view of the shortcomings of conventional apparatus and methods as summarized above, an object of the present invention is to provide charged-particle-beam (CPB) microlithography systems capable of performing alignment-mark measurements by any of multiple candidate techniques and that automatically select the optimal measurement technique for the prevailing conditions.

To such end and according to a first aspect of the invention, CPB microlithography apparatus are provided that include an illumination-optical system, a projection-optical system, and a system for detecting a position of an alignment mark. An exemplary embodiment of such a system comprises a backscattered-electron (BSE) detector, a detection-system selector, and a controller. The BSE detector is situated and configured to detect electrons backscattered from an irradiated alignment mark and output a corresponding BSE-data signal based on a quantity of backscattered electrons detected by the BSE detector. The detection-system selector is situated to receive the BSE-data signal and is configured to select, from among multiple candidate techniques for determining the position of the alignment mark, a particular technique based on a characteristic of the BSE-data signal. The controller is configured to perform any of the candidate techniques. The controller is connected to the detection-system selector and is configured to calculate, according to the selected technique and from the BSE-data signal, the position of the alignment mark.

By way of example, the detection-system selector is configured to select the particular technique based on a detected quantity of data in the BSE-data signal, a prevailing exposure condition, or on a detected symmetry of a waveform of the BSE-data signal.

The various candidate techniques can include a slice-level technique in which the position of the alignment mark is determined to be a center of a range of the BSE-data having a value larger than a value corresponding to a selected slice level. Alternatively or in addition, the candidate techniques can include one or both of a autocorrelation technique in which the position of the alignment mark is determined as a maximum value of an autocorrelation function of the BSE data, and a cross-correlation technique in which the position of the alignment mark is determined as a position at a maximum value of a cross-correlation function of reference data and the BSE data.

To facilitate any of the candidate techniques, a wafer can comprise multiple alignment marks each having a respective set of reference data. The reference data can comprise BSE reference data concerning backscattered electrons produced from a reference alignment mark. Alternatively or in addition, the reference data can comprise BSE reference data concerning backscattered electrons produced from a reference alignment mark on a reference wafer, and/or BSE reference data obtained from a simulation of backscattered electrons from an ideal reference mark on an ideal reference wafer.

The invention also encompasses methods for manufacturing a semiconductor device, wherein the methods include exposing a pattern onto a wafer (or other substrate) using a CPB microlithography apparatus as described herein.

The foregoing and additional features and advantages of the invention will be more readily understood with reference to the following detailed description, which proceeds with reference to the accompanying drawings.

DETAILED DESCRIPTION

The invention is described below in the context of several representative embodiments. It will be understood, however, that the invention is not limited to the representative embodiments.

First Representative Embodiment

Figure 3:
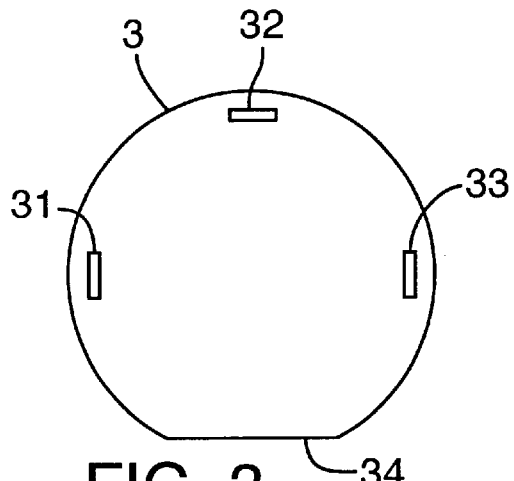
FIG. 3 is a plan view of a wafer including alignment marks.

A charged-particle-beam (CPB) microlithography apparatus according to this embodiment can be used to transfer a pattern, defined by a reticle, onto a semiconductor wafer 3 (see FIG. 3 for a representative wafer 3).

In modern semiconductor fabrication, multiple cycles of "wafer processing" typically are performed on each wafer. During each cycle, the wafer (serving as the substrate) is mounted to a wafer stage in the CPB microlithography apparatus and exposed with a particular pattern in one or more respective locations (dies) on the wafer. The charged particle beam (e.g., electron beam) is used as an energy beam for making the exposure. After each cycle, the wafer is removed from the CPB microlithography apparatus and subjected to other processing. The wafer may return many times to the CPB microlithography apparatus for transfer of patterns for additional layers, each layer usually being of a different pattern.

The pattern in each layer applied to the wafer must be in accurate alignment (registration) with previously applied and subsequently applied patterns. To such end, as shown in FIG. 3, a wafer 3 is provided with an orientation flat 34 and alignment marks 31, 32, 33. The orientation flat 34 is a coarse alignment aid, and the alignment marks 31-33 serve as "fine" positional reference points. In other words, accurate placement of a projected pattern in the dies on the wafer 3 depends upon accurate detection of the respective positions of the alignment marks 31, 32, 33.

Each alignment mark 31, 32, 33 typically includes multiple "elements" such as lines or other appropriate geometric figure. If the elements are defined in a layer of a heavy metal applied on the surface of the wafer 3, then the elements typically appear raised relative to the wafer surface. If the elements are defined as grooves in the wafer surface, then the elements typically appear lower than the wafer surface. The number of alignment marks 31, 32, 33 is not limited to three per wafer. The wafer 3 can have any number of alignment marks as appropriate.

A CPB microlithography apparatus, according to the invention, for exposing the wafer 3 of FIG. 3 includes multiple alignment-mark-detection devices (each type of device also referred to as an "alignment function") for detecting the positions of the alignment marks 31, 32, 33. Each alignment function operates by irradiating the alignment marks 31, 32, 33 with a patterned electron beam (as a representative charged particle beam) that is scanned across the marks 31, 32, 33. Scanning of the marks by the beam causes generation of backscattered electrons from the marks. The backscattered electrons from the alignment marks 31, 32, 33 (and from adjacent regions of the wafer 3) are detected and the resulting signals processed to determine the respective positions of the alignment marks 31, 32, 33.

Alignment-mark-detection devices also are termed herein "alignment devices." Representative alignment devices include threshold-level detection systems (as summarized above) and correlation systems. (See, Bendat et al., Random Data: *Analysis and Measurement Procedures*, 3d ed., John Wiley and Sons, New York, 2000.) Alignment devices typically produce an analog backscattered-electron (BSE) detection signal and convert the analog signals into corresponding digital signals (analog-to-digital, or "AD" conversion) $D_e$. The BSE data encoded in the digital signals are used by the alignment devices for calculations of alignment-mark positions.

In a typical threshold-level detection system (also termed a "slice-level detection system"), discrete BSE-detector readings are obtained as the charged particle beam is scanned across a mark. Discrete data points clustered around the threshold level are "fitted" to suitable respective functions to determine the respective points at which the BSE-detector signal crosses the threshold level. The threshold level can be set by the operator or by the apparatus, based on the BSE-detector data. A threshold-level detection system advantageously determines mark positions with high accuracy even if the amount of available BSE data is small. But, the positional accuracy obtainable with the slice-level system may be inadequate for microlithography involving 100-nm feature sizes, in which position-measurement accuracy must be to a few nanometers.

In a correlation system, an alignment-mark position is determined from a correlation waveform of BSE-detector data. Autocorrelation or cross-correlation of the BSE-detector data is performed to determine a corresponding alignment-mark position. The correlation function that determines the correlation waveform is obtained from the BSE data, and a template is analytically derived from the BSE data itself or from convolutional integration of BSE data obtained through send-ahead. (Bendat et al., Random Data: *Analysis and Measurement Procedures*, 3d ed., John Wiley & Sons, New York, 2000.) A correlation system advantageously can determine alignment-mark positions with high accuracy. However, substantial time is required to perform the necessary calculations, and accuracy is reduced with smaller amounts of BSE data.

According to this embodiment, an appropriate alignment system is automatically selected for the prevailing measurement conditions, with emphasis on balancing the required positional accuracy with permissible calculation time. Details of this embodiment are set forth in FIGS. 1–6.

Figure 1:
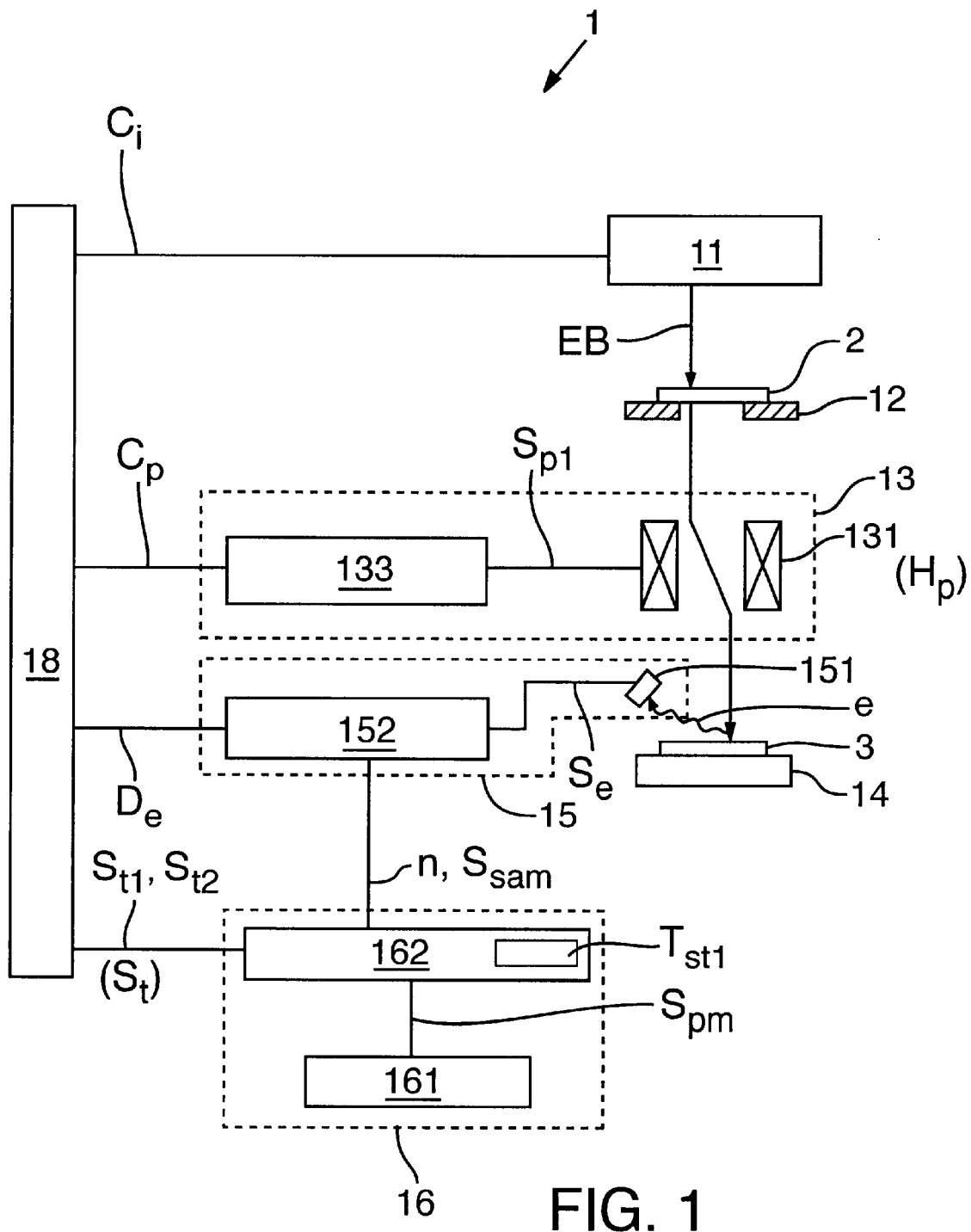
FIG. 1 is a functional block diagram of the charged-particle-beam (CPB) microlithography apparatus of the first representative embodiment.

Referring to FIG. 1, a CPB microlithography apparatus 1 according to this embodiment is configured to project a pattern 21, defined on a reticle 2, onto a wafer 3. The apparatus 1 comprises an illumination-optical system 11, a reticle stage 12, a projection-optical system 13, a wafer stage 14, a BSE detector 15, a detection-system selector 16, and a central controller 18.

The illumination-optical system 11 emits an electron beam EB (as a representative charged particle beam) based on an illumination command $C_i$ from the central controller 18. The illumination command $C_i$ includes data pertaining to turning electron-beam emission on and off, and data pertaining to the particular region of the reticle 2 to be illuminated by the electron beam EB.

Figure 2:
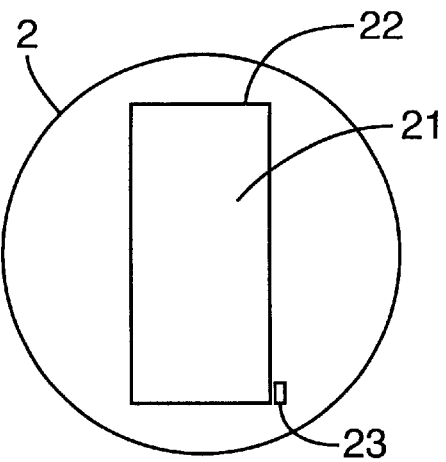
FIG. 2 is a plan view of a reticle including an alignment pattern.

The reticle 2 defines a pattern 21 to be exposed onto the wafer 3. The electron beam EB irradiating the reticle 2 is trimmed (by passage through an appropriately sized aperture in the illumination-optical system 11) to the size and profile of the illuminated portion of the pattern 21. FIG. 2 shows a reticle 2 as viewed from upstream. The reticle 2 includes a patterned area 22 and an alignment pattern 23. The patterned area 22 is the region where the pattern 21, to be exposed onto the wafer 3, is defined. The alignment pattern 23 is scanned at the appropriate time by the electron beam EB, which scans the alignment pattern over the alignment marks 31, 32, 33 provided on the wafer 3.

The apparatus of FIG. 1 includes a reticle stage 12 to which the reticle 2 is mounted. The reticle stage 12 supports the reticle 2 at a position where the electron beam EB from the illumination-optical system 11 can irradiate the patterned area 22 or the alignment pattern 23.

The electron beam EB irradiating the reticle 2 is directed, downstream of the reticle, by the projection-optical system 13 to the wafer 3. I.e., the projection-optical system 13 projects the electron beam from the reticle 2 and focuses the beam on the wafer 3. The projection-optical system 13 includes a deflector 131 and a projection-deflection circuit 133. Upon receiving a projection command $C_p$ from the central controller 18, the projection-deflection circuit 133 generates a projection-deflection signal $S_{p1}$, that is routed to the deflector 131. Hence, the deflector 131 causes the electron beam EB to scan the alignment marks 31, 32, 33. To such end, the deflector 131 produces a deflection magnetic field $H_p$ that laterally deflects the electron beam, based on the projection-deflection signal $S_{p1}$. While scanning the alignment marks 31–33, the electron beam EB additionally may be deflected using electrostatic deflectors (not shown but desirably located just downstream of the deflector 131) to obtain a BSE signal for alignment.

Deflection of the electron beam EB is not instantaneous. Whenever the electron beam is deflected as a result of a deflector being energized, a respective stabilization period (settling time) is experienced in both the illumination-optical system 11 and in the projection-optical system 13. A stabilization period extends from the instant that the deflector is energized to the instant that the respective beam deflection caused by the deflector has stabilized. The stabilization period may not have the same duration in both optical systems, and the stabilization period $T_{sr1}$, noted in FIG. 1 is the longer of the respective stabilization periods experienced in the two optical systems. The stabilization period $T_{sr1}$ is affected by, for example, hardware constituting the illumination-optical system 11 and hardware constituting the projection-optical system 13. More specifically, the stabilization period $T_{sr1}$ is determined by various factors including the inductance of respective deflector coils, as well as parasitic capacitance, inductance, and resistance of cables that provide electrical power to respective deflectors. (I.e., the longer the cable, the longer the stabilization period.) Data concerning numerical values of the stabilization period $T_{sr1}$ are stored in the detection-system selector 16.

The wafer stage 14 supports the wafer 3 during exposure. The wafer stage 14 moves the wafer 3 to a position where the electron beam EB passing through the alignment pattern 23 can scan the alignment marks 31, 32, 33. As the alignment marks are scanned by the beam, backscattered electrons e are produced.

Figure 4:
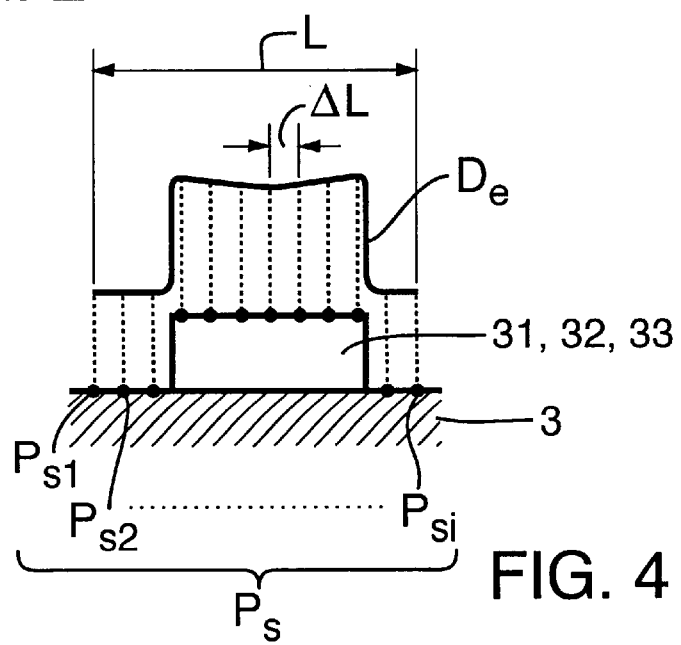
FIG. 4 depicts relationships between a backscattered-electron (BSE) data waveform $D_e$ and position on the wafer 3, as described in the first representative embodiment.

The electron beam EB scans the vicinity of the alignment marks 31, 32, 33 in a discontinuous manner. FIG. 4 shows a representative relationship between the amplitude of the BSE signal $D_e$ and location on the wafer 3 producing the signal. The positions at which the BSE detector 15 detects the backscattered electrons e on the wafer 3 are represented as discrete sampling points $P_{s1}, P_{s2}, \ldots P_{si}$. The sampling points $P_{s1}, P_{s2}, \ldots, P_2$ are collectively referred to as the sampling-point array $P_s$.

Referring further to FIG. 1, the BSE detector 15 comprises a BSE sensor 151 and a BSE-detection circuit 152. The BSE sensor 151 detects the backscattered electrons e from the wafer 3 and produces a corresponding BSE-detection signal Se having a magnitude based on the quantity of backscattered electrons e actually detected. The BSE-detection signal Se is an analog signal. The BSE-detection circuit 152 performs analog-to-digital (AD) conversion of the BSE-detection signal $S_e$ into corresponding BSE data $D_e$. The BSE-detection circuit 152 repeatedly performs AD conversion of the BSE-detection signal $S_e$ exactly according to the number of counts n indicated by a counting signal $S_{sam}$. The BSE-detection circuit 152 integrates the results of the AD conversion and calculates mean values of the resulting digital signals. The mean value is the BSE data $D_e$.

The shortest time interval in which the BSE-detection circuit 152 AD-converts detected backscattered electrons e into corresponding BSE data $D_e$ is a minimum sampling time $T_{smp}$. The minimum sampling time $T_{smp}$ is fixed by the hardware of the BSE-detection circuit 152.

The detection-system selector 16 selects an appropriate alignment-function system for the prevailing conditions. The detection-system selector 16 comprises a console 161 and a data-point number-determination circuit 162. The console 161 allows operator input of system parameters of the CPB microlithography system. The system parameters typically are constants such as the mark-detection range L, sampling pitch ΔL, total sampling time $T_t$, and count number n.

As shown in FIG. 4, the mark-detection range L is the distance over which the electron beam EB scans the alignment marks 31, 32, 33. The mark-detection range L is determined by the operator with reference to the size and type of the alignment marks 31, 32, 33.

The sampling pitch ΔL is the interval between the sampling points in the sampling-point array $P_s$. The sampling pitch ΔL is determined by the operator with reference to the alignment accuracy required by the CPB microlithography apparatus 1. The smaller the sampling pitch ΔL, the greater the potential accuracy of detecting the position of the alignment marks 31, 32, 33.

The total sampling time $T_t$ is the time during which the electron beam EB scans across the mark-detection range L. The alignment operation shall be described later.

The count number n is determined by the operator with reference to the required alignment accuracy. The greater the magnitude of n, the greater the potential accuracy of detecting the positions of the alignment marks 31, 32, 33.

The console 161 outputs a parameter signal $S_{pm}$, encoding the system parameters, to the data-point number-determination circuit 162. The console 161 desirably has a function indicating a selected alignment system. In this case, the data-point number-determination circuit 162 outputs a system-selection signal $S_t$ corresponding to the specific alignment system specified by the console 161.

The data-point number-determination circuit 162 selects, for example, either a slice-level alignment system or a correlation alignment system. A correlation system can be an autocorrelation system or a cross-correlation system. (See Bendat et al., Random Data: *Analysis and Measurement Procedures*, 3d ed., John Wiley & Sons, New York, 2000.) The data-point number-determination circuit 162 stores data concerning the minimum sampling time $T_{smp}$ and the stabilization period $T_{st1}$.

The data-point number-determination circuit 162 uses Equation (1) to predict the quantity N of data in the BSE data $D_e$:

$$N = L/\Delta L \qquad (1)$$

Whenever the quantity N of data is less than a specified threshold value, then the data-point number-determination circuit 162 selects a slice-level alignment system. Conversely, whenever the quantity N of data is larger than a specified threshold value, then the data-point number-determination circuit 162 selects a correlation alignment system. Hence, the CPB microlithography apparatus 1 automatically selects the most suitable alignment system for the prevailing conditions.

Whenever a slice-level alignment system is selected, the data-point number-determination circuit 162 outputs a first system-selection signal $S_{t1}$ indicating a slice-level system. Conversely, whenever a correlation system is selected, the data-point number-determination circuit 162 outputs a second system-selection signal $S_{t2}$ indicating the correlation system. The system-selection signals $S_{t1}$, $S_{t2}$ are collectively referred to as the system-selection signal $S_t$.

The detection-system selector 16 outputs the count number n to the BSE detection circuit 152.

The central controller 18 controls the illumination-optical system 11, the projection-optical system 13, and the BSE detector 15. The central controller 18 outputs an illumination command $C_i$ to the illumination-optical system 11, and outputs a projection command $C_p$ to the projection-optical system 13. The central controller 18 also inputs the BSE data $D_e$ from the BSE detector 15, and inputs the system-selection signal $S_t$ from the detection-system selector 16.

Figure 5:
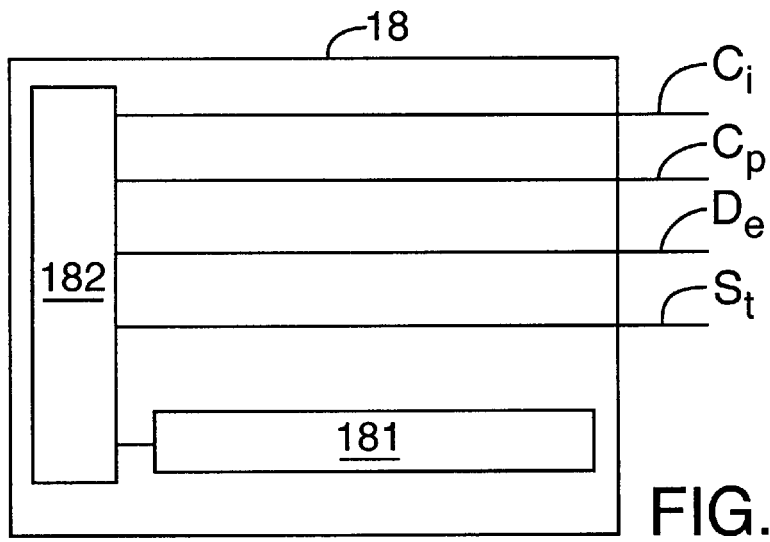
FIG. 5 is a functional block diagram of certain operations performed by the central controller of the first representative embodiment.

The central controller 18 is explained further below with reference to FIGS. 5 and 6. Turning first to FIG. 5, the central controller 18 comprises a memory 181 (such as a hard disk memory or semiconductor memory) and a CPU 182. The memory 181 stores respective programs for executing a slice level system and for executing a correlation system. The memory 181 also stores data needed for executing these programs. If a correlation alignment system is selected, then the operator selects from among several possible correlation-system programs, and stores, in advance in the memory 181, either a program for executing an autocorrelation system or a program for executing a cross-correlation system.

Figure 6:
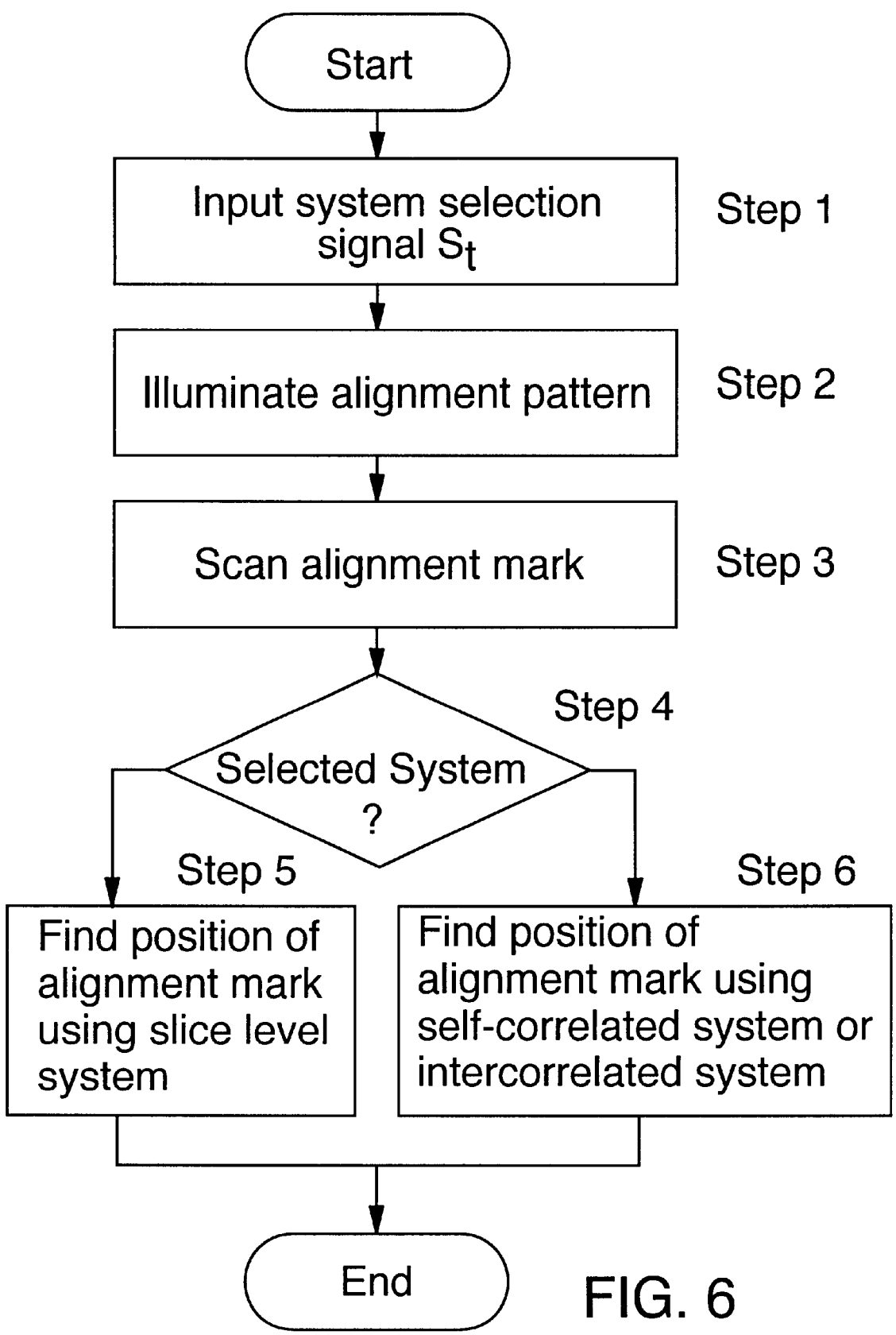
FIG. 6 is a flow chart of a method for determining the position of an alignment mark according to the first representative embodiment.

The CPU 182 actually executes the selected program, as shown in FIG. 6. In Step 1, the CPU 182 inputs a system-selection signal $S_t$ from the detection-system selector 16 and stores the selected system indicated by the system-selection signal $S_t$. In Step 2, the CPU 182 outputs an illumination command $C_i$ to the illumination-optical system 11, thereby causing the alignment pattern 23 to be illuminated. In Step 3, the CPU 182 outputs a projection command $C_p$ to the projection-deflection circuit 133, thereby causing a first alignment mark 31 to be scanned with the electron beam passing through the alignment pattern 23. The CPU 182 inputs the BSE data $D_e$ obtained by the BSE detector 15 from such scanning, and stores the data in the memory 181. In Step 4, the CPU 182 determines whether the system indicated by the system-selection signal $S_t$ is a slice-level system or a correlation system. If the indicated system is a slice-level system, then Step 5 is executed after Step 4. In Step 5, the CPU 182 executes a slice-level system using the BSE data $D_e$ stored in the memory 181, and determines the position of the first alignment mark 31. The CPU 182 stores the determined position of the first alignment mark 31 in the memory 181. After the CPU 182 has finished executing Step 5, the operation of finding the position of the first alignment mark 31 ends.

Returning to Step 4, if the CPU 182 determines that the system indicated by the system-selection signal $S_t$ is a correlation system, then Step 6 is executed after Step 4. In Step 6, if the correlation-system program stored in the memory 181 is the autocorrelation system, then the auto-correlated system is executed for determining the position of the first alignment mark 31. On the other hand, if the correlation-system program stored in the memory 181 is the cross-correlation system, then the cross-correlation system is executed for determining the position of the first alignment mark 31. The CPU 182 stores, in the memory 181, the determined position of the first alignment mark 31. After the CPU 182 completes executing Step 6, the operation of finding the position of the first alignment mark 31 ends.

After determining the position of the alignment mark 31, the CPU executes Step 3 through Step 6 for the alignment marks 32 and 33.

This embodiment is not limited to situations in which a wafer 3 is microlithographically exposed. This embodiment also can be applied to CPB microlithography apparatus that process masks or reticles. Also, this embodiment is not limited to a CPB microlithography in which the energy beam is an electron beam. This embodiment also can be applied to CPB microlithography apparatus that utilize an ion beam as an energy beam.

Figure 7:
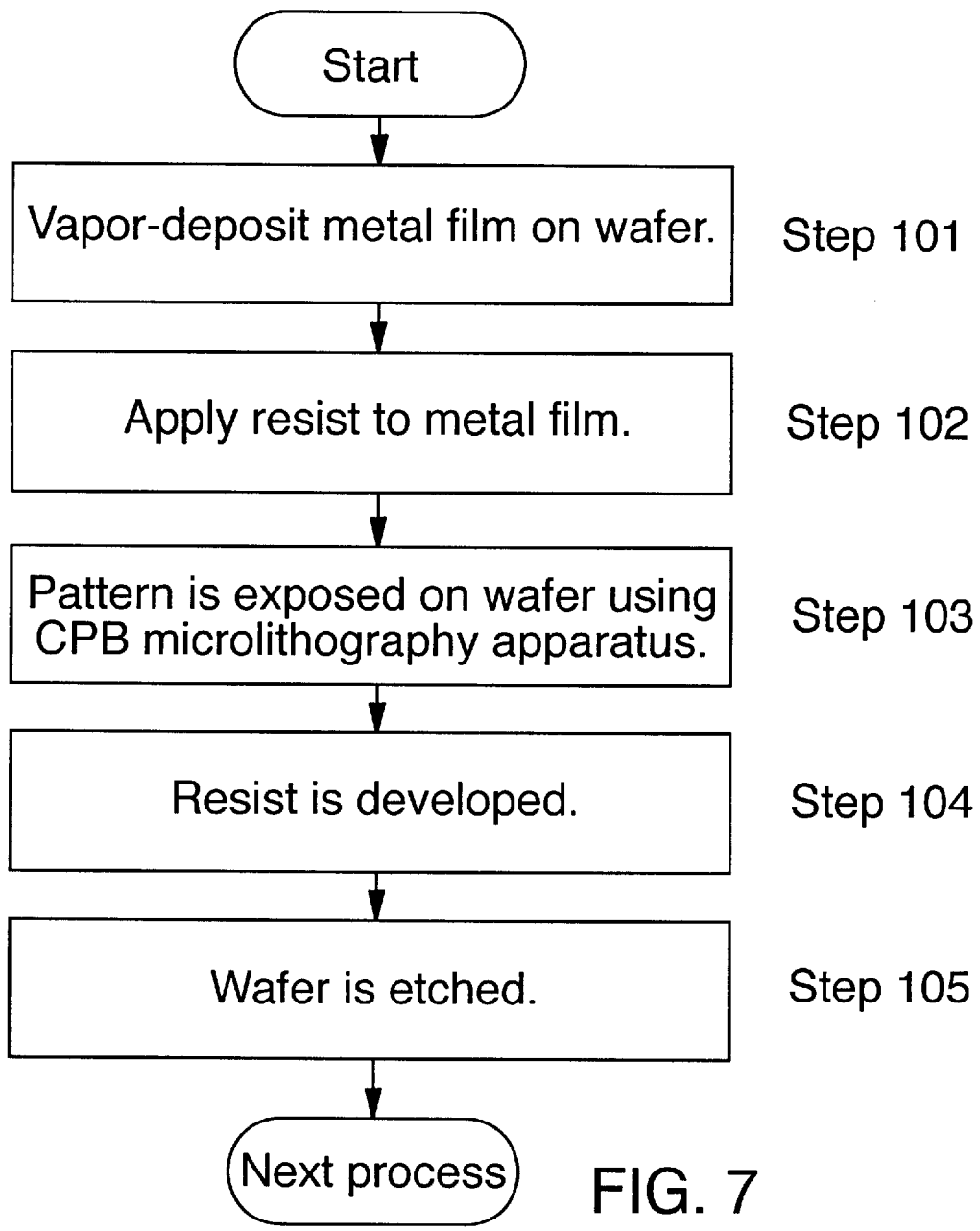
FIG. 7 is a flow chart of a wafer-processing method.

Referring now to FIG. 7, an exemplary method for manufacturing a semiconductor device is described, wherein the method includes a microlithography step using the CPB microlithography apparatus 1 described above.

In Step 101, a metal film is deposited (e.g., by metal-vapor deposition) on a wafer 3.

In Step 102, a resist is applied to the metal film deposited on the wafer 3.

In Step 103, the elements of a pattern 21 defined by a reticle 2 are sequentially exposed onto the wafer 3 using the CPB microlithography apparatus 1.

In Step 104, the resist (with imprinted pattern 21) is developed.

In Step 105, the wafer is etched, using the developed resist as a mask. During etching, elements corresponding to the features of the pattern defined by the reticle 2 are formed on the wafer 3.

After completing Step 105, other circuits (layers) can be formed on the wafer as required atop the layer formed in Steps 101–105 until manufacture of the respective semiconductor devices on the wafer is completed.

In any event, during CPB microlithography as described above, the CPB microlithography apparatus 1 determines the positions of the alignment marks 31, 32, 33 with high accuracy and without decreasing throughput.

Second Representative Embodiment

In this embodiment, an alignment system is selected that provides high positional accuracy for the prevailing conditions. In this embodiment, components that are the same as corresponding components in the first representative embodiment have the same respective reference numerals and are not described further.

Figure 8:
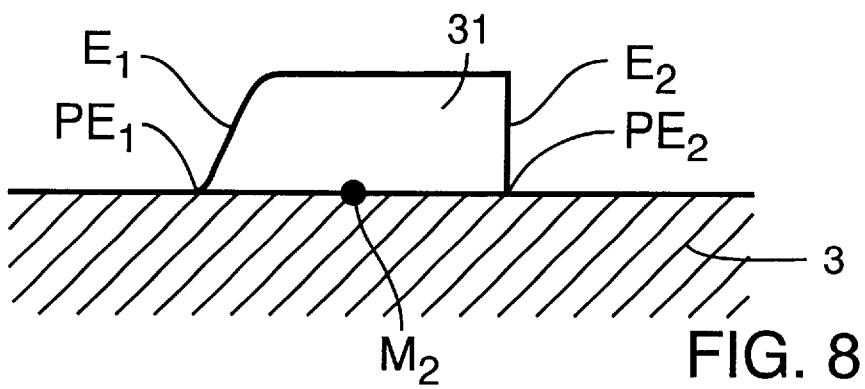
FIG. 8 is an elevational section of an alignment mark as described in the second representative embodiment.
Figure 9A:
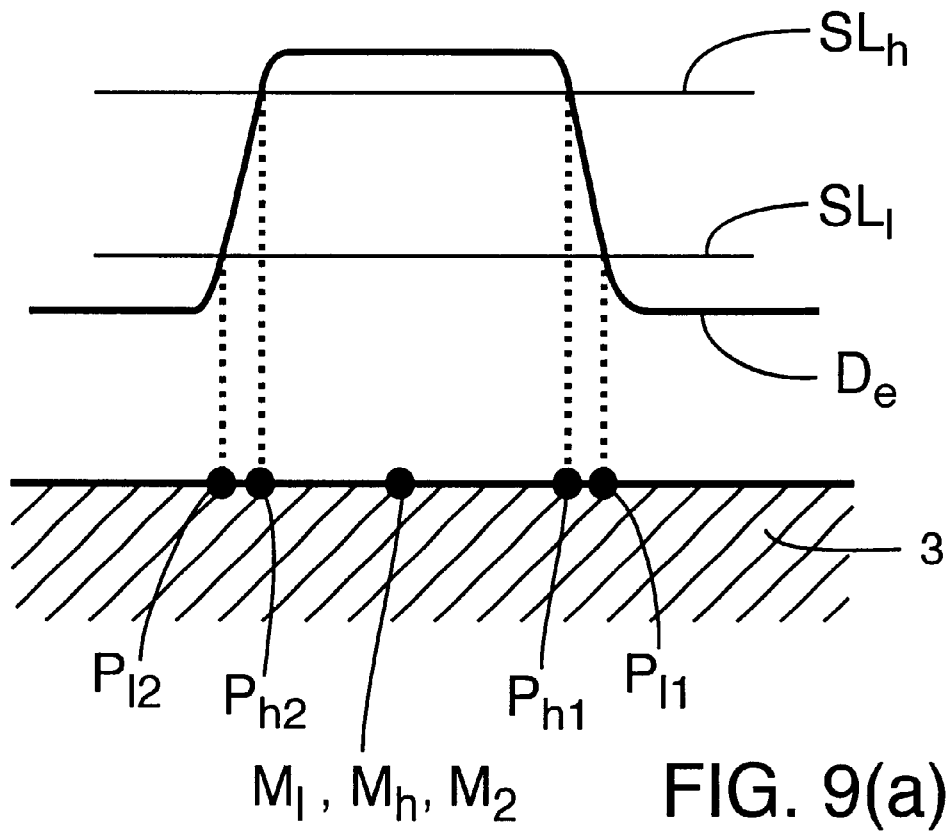
FIG. 9(a) depicts an exemplary symmetrical waveform of BSE data $D_e$.
Figure 9B:
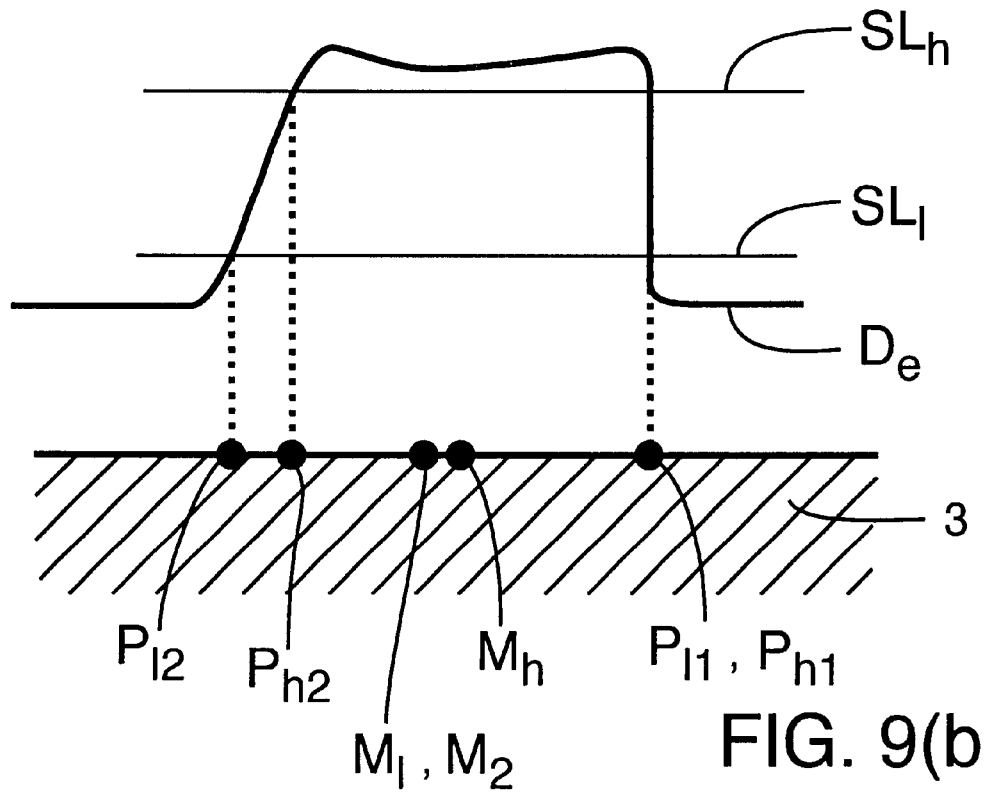
FIG. 9(b) depicts an exemplary asymmetrical waveform of BSE data $D_e$.
Figure 10:
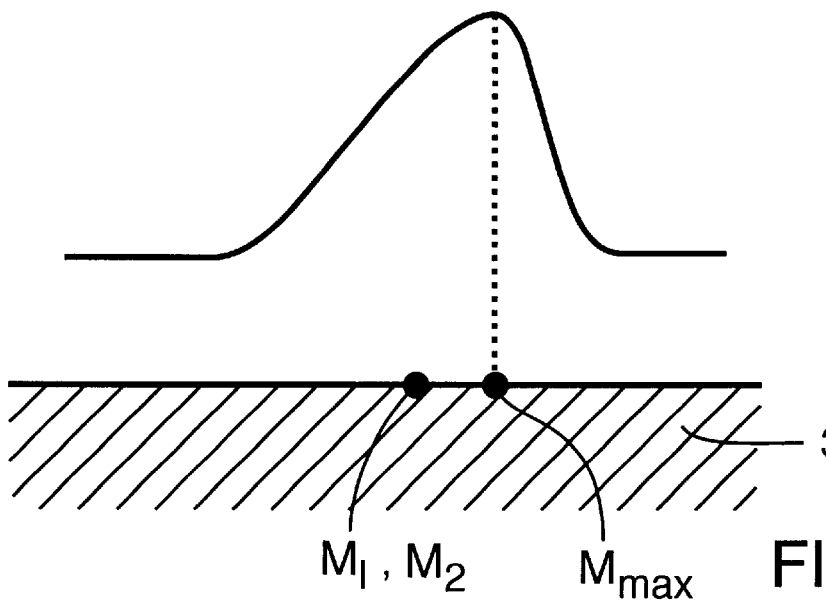
FIG. 10 depicts an exemplary correlation function for the BSE data $D_e$ of FIG. 9(b).

Certain aspects of the wafer 3 and of the alignment system of this embodiment are explained with reference to FIGS. 8–10. FIG. 8 is an elevational section of the alignment mark 31. FIG. 9(a) depicts an exemplary waveform of BSE data $D_e$ that is highly symmetrical, and FIG. 9(b) depicts an exemplary waveform of BSE data $D_e$ having low symmetry. FIG. 10 depicts an exemplary correlation function for the BSE data $D_e$ of FIG. 9(b).

The sectional profiles of the alignment marks 31, 32, 33 ideally are laterally symmetrical. Such alignment marks produce laterally symmetrical waveforms of BSE data $D_e$, as shown in FIG. 9(a). However, in actual practice, as a result of various processes performed on the wafer 3 during wafer processing, the sectional profiles of the alignment marks 31, 32, 33 may not be or may not remain laterally symmetrical.

For example, during wafer processing, the alignment mark 31 may become deformed into a profile such as shown in FIG. 8. In FIG. 8, the alignment mark 31 has a first end face El that inclines toward a second end face $E_2$. This asymmetry was caused by upstream wafer processing.

Despite these changes, the actual position of the alignment mark 31 is unchanged. That is, the position of a first endpoint $PE_1$ (where the first end face $E_1$ intersects the surface of the wafer 3) and the position of a second endpoint $PE_2$ (where the second end face $E_2$ intersects the surface of the wafer 3) are unchanged.

Even an asymmetrical alignment mark 31, as shown in FIG. 8, has a center point $M_2$, which is the mid-point between the first end point $PE_1$, and the second end point $PE_2$.

As produced by an alignment mark 31 as shown in FIG. 8, the corresponding BSE data D$e$ has a profile that is laterally asymmetrical, as shown in FIG. 9(b). More specifically, the FIG. 9(b) waveform has a center point $M_h$ and a center point $M_2$ that are at different positions (although nearly at the same position). (In FIG. 9(b), $M_h=(P_{h1}+Ph_2)/2$, $M_1=(P_{l1}+P_{l2})/2$, and $M_2+(PE_1+PE_2)/2$. The amount of misalignment is determined from $|M_h-M_l>|M_1-M_2|$.) The same applies to the other alignment marks 32, 33. Hence, even if the BSE data $D_e$ is not laterally symmetrical, a slice-level detection system can increase the positional accuracy of the alignment marks by changing the threshold (slice) level.

On the other hand, the correlation function for the BSE-data profile of FIG. 9(b) has a waveform as exemplified in FIG. 10. In FIG. 10, the position (on the wafer 3) corresponding to the maximum value of the correlation function of the laterally asymmetrical BSE data $D_e$ (this position is referred to as a "maximum point" $M_{max}$) is beyond the center point $M_l$, or the center point $M_h$. Hence, in cases in which the BSE data $D_e$ is laterally asymmetrical, the correlation system tends to determine the positions of the alignment marks 31, 32, 33 with lower accuracy than a slice-level system.

Figure 11:
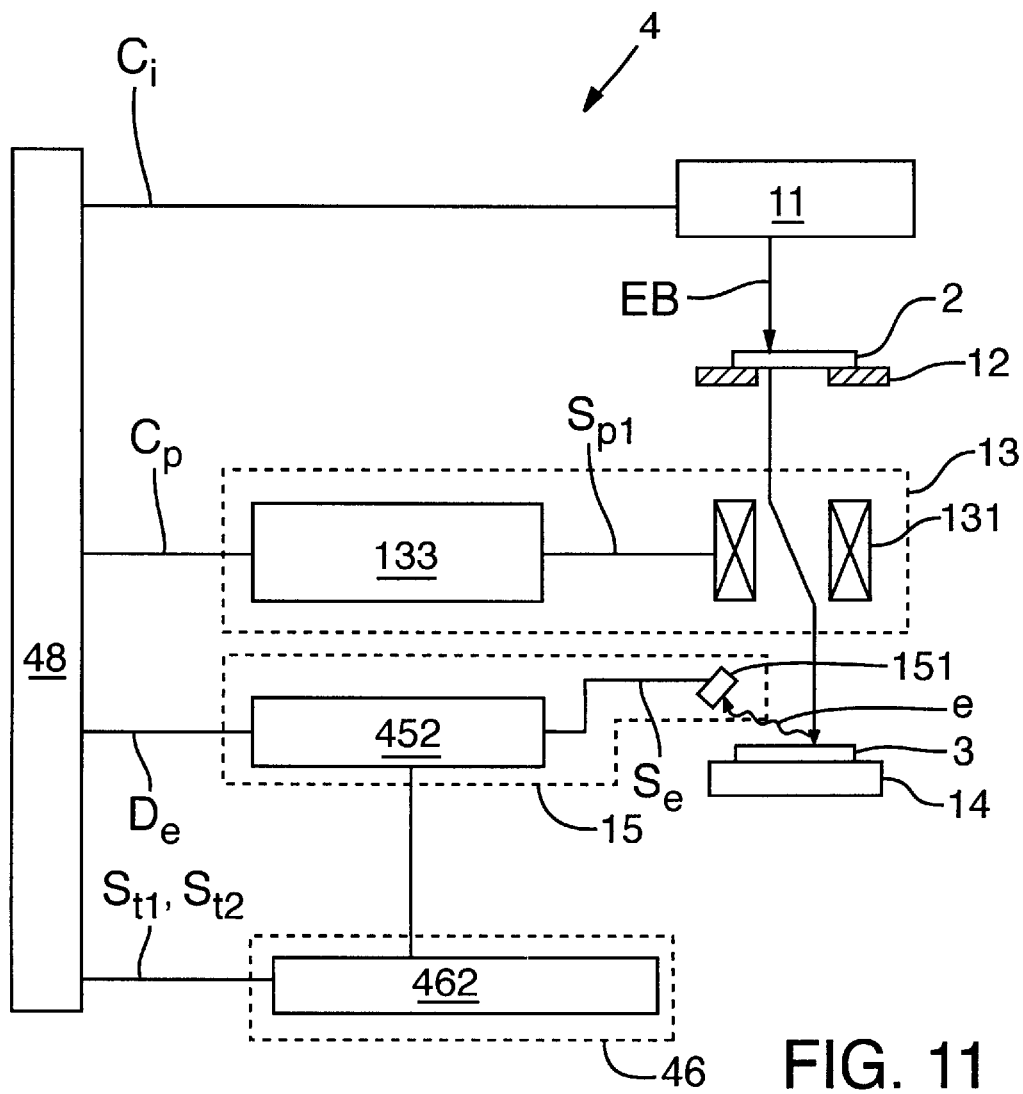
FIG. 11 is a functional block diagram of the CPB microlithography apparatus of the second representative embodiment.

The functions and operation of this embodiment are explained with reference to FIGS. 9(a)–9(b) and 11. FIG. 11 is a block diagram illustrating operation of a CPB microlithography apparatus 4 according to this embodiment. This second representative embodiment differs from the first representative embodiment only with regard to the BSE-detection circuit 452, the detection-system selector 46, and the central controller 48.

The BSE-detection circuit 452 in this embodiment has the same function as the BSE-detection circuit 152 in the first representative embodiment, except that the BSE-detection circuit 452 stores the count number n. Hence, a detailed explanation of the BSE-detection circuit 452 is omitted.

The detection-system selector 46 automatically selects the best alignment-function system for the prevailing circumstances. The detection-system selector 46 is provided with a symmetry-determination circuit 462. The symmetry-determination circuit 462 selects a slice-level system or a correlation system, depending upon prevailing circumstances. The symmetry-determination circuit 462 determines the symmetry of the waveform of the BSE data $D_e$ representing the respective profiles of the alignment marks 31, 32, 33.

The manner in which the symmetry-determination circuit 462 determines waveform symmetry is as follows. As shown in FIGS. 9(a) and 9(b), the symmetry-determination circuit 462 slices the BSE data waveform $D_e$ at a "high" slice level $SL_h$ and at a "low" slice level $SL_l$. The slice points $P_{h1}$ and $P_{h2}$ are respective positions on the wafer 3 corresponding to intersections between the "high" slice level $SL_h$ and the BSE data waveform $D_e$. The slice points $P_{l1}$ and $P_{l2}$ on the wafer 3 correspond to intersections between the "low" slice level $SL_l$ and the BSE data waveform $D_e$.

As shown in FIG. 9(a), whenever the BSE data waveform is symmetrical, the center point $M_h$ (which is the center point of the high slice points $P_{h1}$ and $P_{h2}$) and the center point $M_l$ (which is the center point of the low slice points $P_{l1}$ and $P_{l2}$) and the center point $M_2$ are at nearly the same position. On the other hand, as shown in FIG. 9(b), with an asymmetrical BSE data waveform, the center point $M_h$ and the center point $M_l$ are at different positions.

Whenever there is little distance between the center point $M_l$ and center point $M_h$, the symmetry-determination circuit 462 determines that the waveform of the BSE data De is highly symmetrical; conversely, whenever the distance between $M_l$ and $M_h$ is large, the symmetry-determination circuit 462 determines that the waveform of the BSE data $D_e$ is low. Whenever the symmetry-determination circuit 462 determines in this manner that the waveform of the BSE data $D_e$ has low symmetry, the symmetry-determination circuit 462 selects a slice-level system. Whenever the symmetry-determination circuit 462 determines in this manner that the waveform of the BSE data $D_e$ is symmetrical, the symmetry-determination circuit 462 selects a correlation system.

If the symmetry-determination circuit 462 selects a slice-level system, then the circuit outputs a first system-selection signal $S_{r1}$. If a correlation system is selected, then the circuit outputs a second system-selection signal $S_{r2}$.

Thus, the alignment system is selected according to the symmetry of the BSE data $D_e$. The CPB microlithography apparatus 4 including such a system advantageously determines the respective positions of the alignment marks 31, 32, 33 with high positional accuracy.

The central controller 48 has the same function as the central controller 18 of the first representative embodiment, except for using a slice level $SL_l$ in a slice-level system. Whenever a system-selection signal $S_{r1}$ is input to the central controller 48, the central controller 48 slices the BSE data waveform $D_e$ at a slice level $SL_l$, and finds a corresponding center point $M_l$. The center point M, represents the position of the alignment marks 31, 32, 33 in a slice-level system.

Whereas the invention has been described in connection with several representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. In a charged-particle-beam (CPB) microlithography apparatus including an illumination-optical system and a projection-optical system, a system for detecting a position of an alignment mark, the system comprising:

a backscattered-electron (BSE) detector situated and configured to detect electrons backscattered from an irradiated alignment mark and output a corresponding BSE-data signal based on a quantity of backscattered electrons detected by the BSE detector;

a detection-system selector situated to receive the BSE-data signal and configured to select, from among multiple candidate techniques for determining the position of the alignment mark, a particular technique based on a characteristic of the BSE-data signal; and a controller configured to perform any of the candidate techniques, the controller being connected to the detection-system selector and configured to calculate, according to the selected technique and from the BSE-data signal, the position of the alignment mark.

2. The system of claim 1, wherein the detection-system selector is configured to select the particular technique based on a detected quantity of data in the BSE-data signal.

3. The system of claim 1, wherein the detection-system selector is configured to select the particular technique based on a prevailing exposure condition.

4. The system of claim 1, wherein the detection-system selector is configured to select the particular technique based on a detected symmetry of a waveform of the BSE-data signal.

5. The system of claim 1, wherein the multiple candidate techniques include a slice-level technique in which the position of the alignment mark is determined to be a center of a range of the BSE-data having a value larger than a value corresponding to a selected slice level.

6. The system of claim 1, wherein the multiple candidate techniques include one or both of an autocorrelation technique in which the position of the alignment mark is determined as a maximum value of an autocorrelation function of the BSE data, and a cross-correlation technique in which the position of the alignment mark is determined as a position at a maximum value of a cross-correlation function of reference data and the BSE data.

7. The system of claim 6, wherein the wafer comprises multiple alignment marks each having a respective set of reference data.

8. The system of claim 6, wherein the reference data comprises BSE reference data concerning backscattered electrons produced from a reference alignment mark.

9. The system of claim 6, wherein the reference data comprises BSE reference data concerning backscattered electrons produced from a reference alignment mark on a reference wafer, or BSE reference data obtained from a simulation of backscattered electrons from an ideal reference mark on an ideal reference wafer.

10. A charged-particle-beam microlithography apparatus, comprising:

illumination means for illuminating a reticle with an illumination charged particle beam;

projection means for illuminating a substrate with a charged particle beam passing through the reticle;

detection means for detecting backscattered electrons emitted by the substrate provided with an alignment mark, and for outputting backscattered-electron (BSE) data based on a quantity of backscattered electrons;

detection-system-selection means for selecting, from among a plurality of techniques and corresponding systems for detecting a position of the alignment mark, one of the techniques and corresponding systems based on the BSE data; and calculation means for determining the alignment-mark position via a calculation involving the BSE data, according to the selected technique and corresponding system selected by the detection-system-selection means.

* * * * *

UNITED STATES PATENT AND TRADEMARK OFFICE
CERTIFICATE OF CORRECTION

PATENT NO. : 6,541,779 B2
DATED : April 1, 2003
INVENTOR(S) : Fujiwara

It is certified that error appears in the above-identified patent and that said Letters Patent is hereby corrected as shown below:

Column 6,
Line 19, "$P_2$" should be -- $P_{si}$ --.

Column 9,
Line 30, "E1" should be -- $E_1$ --.
Line 44, "D$e$" should be -- $D_e$ --.

Column 10,
Line 43, "De" should be -- $D_c$ --.

Column 11,
Line 2, "M," should be -- $M_1$, --.

Signed and Sealed this

Thirtieth Day of December, 2003

JAMES E. ROGAN
*Director of the United States Patent and Trademark Office*

UNITED STATES PATENT AND TRADEMARK OFFICE
CERTIFICATE OF CORRECTION

PATENT NO.     : 6,541,779 B2
DATED          : April 1, 2003
INVENTOR(S)    : Fujiwara It is certified that error appears in the above-identified patent and that said Letters Patent is hereby corrected as shown below:

Column 6,
Line 19, "$P_2$" should be -- $P_{si}$ --.

Column 9,
Line 30, "E1" should be -- $E_1$ --.
Line 44, "D$e$" should be -- $D_e$ --.

Column 10,
Line 43, "De" should be -- $D_e$ --.

Column 11,
Line 2, "M," should be -- $M_1$, --.

This certificate supersedes Certificate of Correction issued December 30, 2003.

Signed and Sealed this

Twenty-second Day of June, 2004

JON W. DUDAS
*Acting Director of the United States Patent and Trademark Office*